United States Patent
Okuyama et al.

(10) Patent No.: US 12,143,099 B2
(45) Date of Patent: Nov. 12, 2024

(54) SWITCHING ELEMENT DRIVING METHOD AND SWITCHING ELEMENT DRIVING DEVICE

(71) Applicant: Nissan Motor Co., Ltd., Kanagawa (JP)

(72) Inventors: Yuka Okuyama, Kanagawa (JP); Kazushige Namiki, Kanagawa (JP); Keita Abe, Kanagawa (JP)

(73) Assignee: Nissan Motor Co., Ltd., Kanagawa (JP)

( * ) Notice: Subject to any disclaimer, the term of this patent is extended or adjusted under 35 U.S.C. 154(b) by 23 days.

(21) Appl. No.: 18/043,437

(22) PCT Filed: Aug. 28, 2020

(86) PCT No.: PCT/JP2020/032779
§ 371 (c)(1),
(2) Date: Feb. 28, 2023

(87) PCT Pub. No.: WO2022/044298
PCT Pub. Date: Mar. 3, 2022

(65) Prior Publication Data
US 2023/0327658 A1    Oct. 12, 2023

(51) Int. Cl.
*H02M 1/088*       (2006.01)
*H02M 7/539*       (2006.01)
*H03K 17/14*       (2006.01)

(52) U.S. Cl.
CPC ............ *H03K 17/14* (2013.01); *H02M 1/088* (2013.01); *H02M 7/539* (2013.01)

(58) Field of Classification Search
CPC ..... H03K 17/14; H03K 17/145; H02M 1/088; H02M 7/539
USPC .......................................... 327/108, 109, 110
See application file for complete search history.

(56) References Cited

U.S. PATENT DOCUMENTS

| | | | |
|---|---|---|---|
| 6,366,153 B1* | 4/2002 | Arslain | H03K 17/0822 327/512 |
| 9,046,912 B1 | 6/2015 | Liu et al. | |
| 2018/0167013 A1* | 6/2018 | Xu | H02P 27/06 |
| 2020/0106433 A1* | 4/2020 | Yamato | H03K 17/163 |
| 2023/0122671 A1* | 4/2023 | Mitsui | H03K 17/0822 361/93.8 |
| 2023/0208274 A1* | 6/2023 | Sakai | H02M 1/0009 |

(Continued)

FOREIGN PATENT DOCUMENTS

| | | |
|---|---|---|
| JP | 2015-159712 A | 9/2015 |
| WO | 2016/117459 A1 | 7/2016 |

*Primary Examiner* — William Hernandez
(74) *Attorney, Agent, or Firm* — Osha Bergman Watanabe & Burton LLP

(57) ABSTRACT

A switching element driving method executed in a switching element driving device including a plurality of switching elements and a driving circuit configured to drive the plurality of switching elements, the switching element driving method including: detecting temperatures of the plurality of switching elements; calculating a switching determination temperature that serves as a reference for changing switching speeds of the switching elements from the plurality of detected temperatures; and changing the switching speeds of all the switching elements based on the switching determination temperature.

5 Claims, 5 Drawing Sheets

(56) References Cited

U.S. PATENT DOCUMENTS

2023/0327659 A1\* 10/2023 Akahane ............ H03K 17/0828
2023/0412109 A1\* 12/2023 Lim ........................ H02P 27/08

\* cited by examiner

SWITCHING ELEMENT DRIVING METHOD AND SWITCHING ELEMENT DRIVING DEVICE

TECHNICAL FIELD

The present invention relates to a switching element driving method and a switching element driving device.

BACKGROUND ART

WO 2016/117459 A1 proposes a control method of a driving circuit including a plurality of semiconductor switching elements. In particular, in the control method of WO 2016/117459 A1, a loss of the switching element is reduced by adjusting a switching speed (operating speed of the switching element) based on a temperature of the switching element.

SUMMARY OF INVENTION

In the control method of WO 2016/117459 A1, a temperature of each semiconductor switching element is detected and a switching speed is individually adjusted for each element. Therefore, it is necessary to provide a driving circuit for controlling the switching speed for each element, which causes a problem of increasing a size of an entire device.

Therefore, an object of the present invention is to provide a switching element driving device and a switching element driving method capable of suitably adjusting a switching speed while preventing an increase in a size of an entire device.

According to an aspect of the present invention, a switching element driving method executed in a switching element driving device including a plurality of switching elements and a driving circuit configured to drive the plurality of switching elements is provided. The switching element driving method includes: detecting temperatures of the plurality of switching elements; calculating a switching determination temperature that serves as a reference for changing switching speeds of the switching elements from the plurality of detected temperatures; and changing the switching speeds of all the switching elements based on the switching determination temperature.

DESCRIPTION OF EMBODIMENTS

Figure 1:
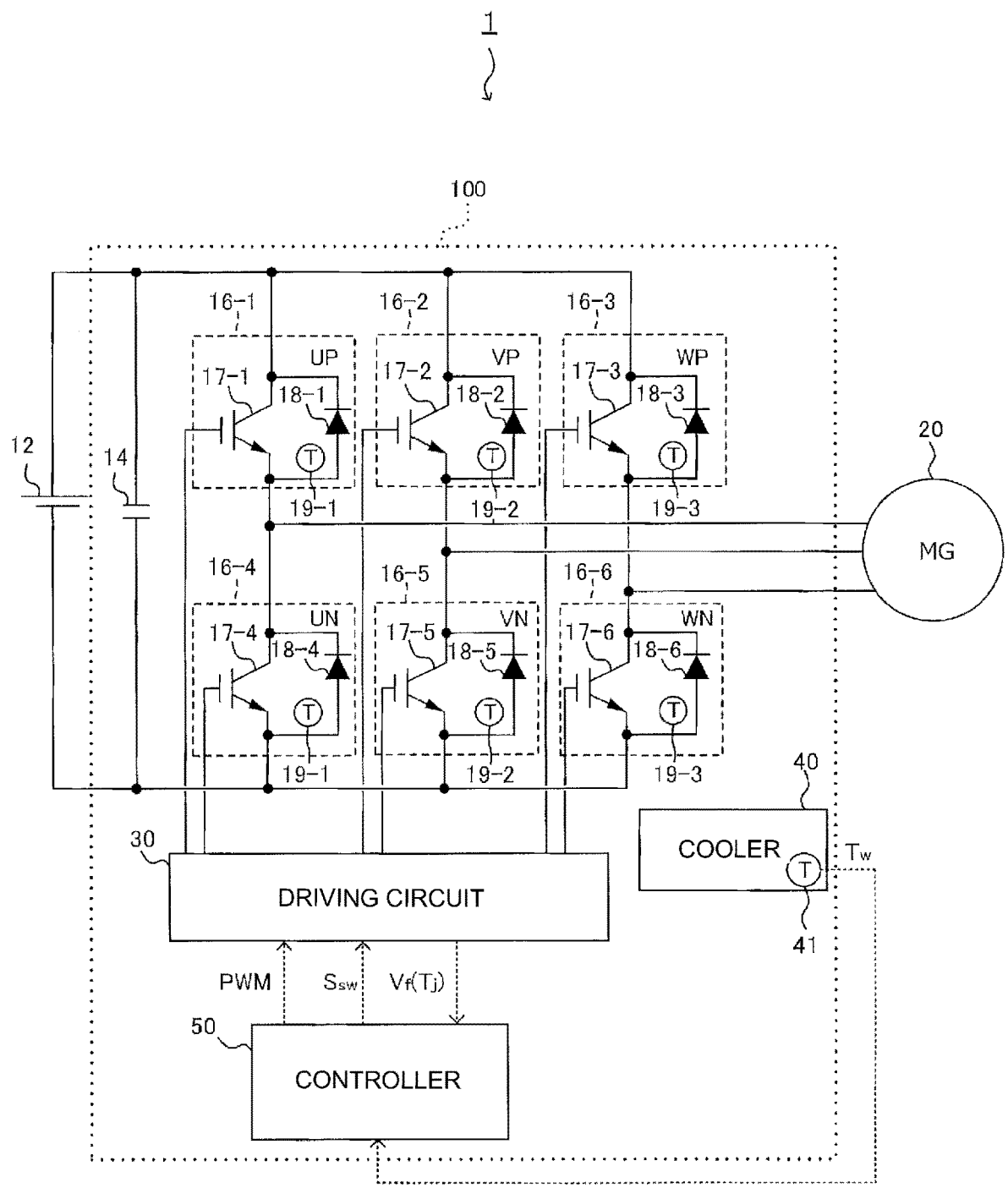
FIG. 1 is a diagram illustrating a configuration of an electric motor control system provided with a switching element driving device according to an embodiment of the present invention.

Hereinafter, embodiments of the present invention will be described with reference to the drawings FIG. 1 is a diagram illustrating a configuration of an electric motor control system 1 to which a switching element driving device 100 according to the present embodiment is applied. As illustrated, the electric motor control system 1 mainly includes a battery 12 as a direct current power supply, a switching element driving device 100, and a motor 20 configured as a three-phase alternating current motor for vehicles, for example.

In particular, the switching element driving device 100 according to the present embodiment is configured as a power converter that adjusts power supplied from the battery 12 to the motor 20 (or regenerative power from the motor 20 to the battery 12). More specifically, the switching element driving device 100 is assumed to be an inverter that performs power conversion from a direct current to a three-phase alternating current or from the three-phase alternating current to the direct current between the battery 12 and the motor 20.

The switching element driving device 100 includes a smoothing capacitor 14 that prevents a ripple, a plurality of (six in the drawing) power semiconductor element units 16-1 to 16-6 that constitute a switching circuit, a driving circuit 30 that drives the power semiconductor element units 16, a cooler 40, and a controller 50 as a control unit.

The power semiconductor element units 16-1 to 16-6 are implemented by six arms in three phases, that is, upper arms UP, VP, WP and lower arms UN, VN, WN in three phases of UVW, and include voltage-controlled switching elements 17-1 to 17-6 implemented by semiconductor elements such as insulated gate bipolar transistors (IGBT), and flyback diodes 18-1 to 18-6 through which a return current flows from the motor 20 when the switching elements 17-1 to 17-6 are turned off. In addition, the power semiconductor element units 16-1 to 16-6 are respectively provided with temperature detection diodes 19-1 to 19-6 functioning as temperature sensors. In the present embodiment, the plurality of power semiconductor element units 16-1 to 16-6 constitute an element module.

The driving circuit 30 is connected in parallel to each of the switching elements 17-1 to 17-6. The driving circuit 30 drives (turns on or off) each of the switching elements 17 based on a pulse width modulation (PWM) signal and a speed switching signal $S_{sw}$ input from the controller 50. According to the switching operation, a direct current power from the battery 12 is converted into a desired alternating current power and is supplied to the motor 20 during power running of the motor 20. Meanwhile, during regeneration of the motor 20, rotational energy of the motor 20 is converted into a direct current power and is supplied to the battery 12.

The driving circuit 30 monitors VF voltages $V_{f1}$ to $V_{f6}$ generated by the temperature detection diodes 19-1 to 19-6 and detects the VF voltages as element temperatures $T_{j1}$ to $T_{j6}$. The driving circuit 30 outputs the detected element temperatures $T_{j1}$ to $T_{j6}$ to the controller 50.

The cooler 40 cools the power semiconductor element units 16. The cooler 40 is implemented by, for example, a water jacket for supplying cooling water to the power semiconductor element units 16 to cool the power semiconductor element units 16. The cooler 40 is provided with a cooling water temperature sensor 41 that detects a temperature of the cooling water.

The controller 50 is implemented by a computer including a central processing unit (CPU), a read-only memory (ROM), a random access memory (RAM), and an input/output interface (an I/O interface) and programmed to execute processing described later. The controller 50 can be implemented by a plurality of computer hardware that distributes and executes the processing.

The controller 50 makes a required torque of the motor 2 which is an electrical load as an input, and generates a PWM signal for defining a switching pattern (duty ratio) of each of the switching elements 17. More specifically, the controller 50 calculates a target power (voltage command value) supplied to the motor 2 so as to achieve a desired required torque according to an externally required load (an amount of operation on an accelerator pedal in a case of a vehicle, and the like), and generates the PWM signal to achieve the calculated voltage command value.

The controller 50 receives, as inputs, the element temperatures $T_{j1}$ to $T_{j6}$ from the driving circuit 30 and a cooling water temperature $T_w$ which is a value detected by the cooling water temperature sensor 41, and executes switching signal generation processing. More specifically, with reference to the element temperatures $T_{j1}$ to $T_{j6}$ and the cooling water temperature $T_w$, the controller 50 generates a speed switching signal $S_{sw}$ for commanding the driving circuit 30 to perform driving with switching speeds of all the switching elements 17-1 to 17-6 set as switching speeds corresponding to a high speed mode or a low speed mode which will be described later. The switching signal generation processing will be described later in detail. Hereinafter, further details regarding the configuration of the switching element driving device 100 will be described.

Figure 2:
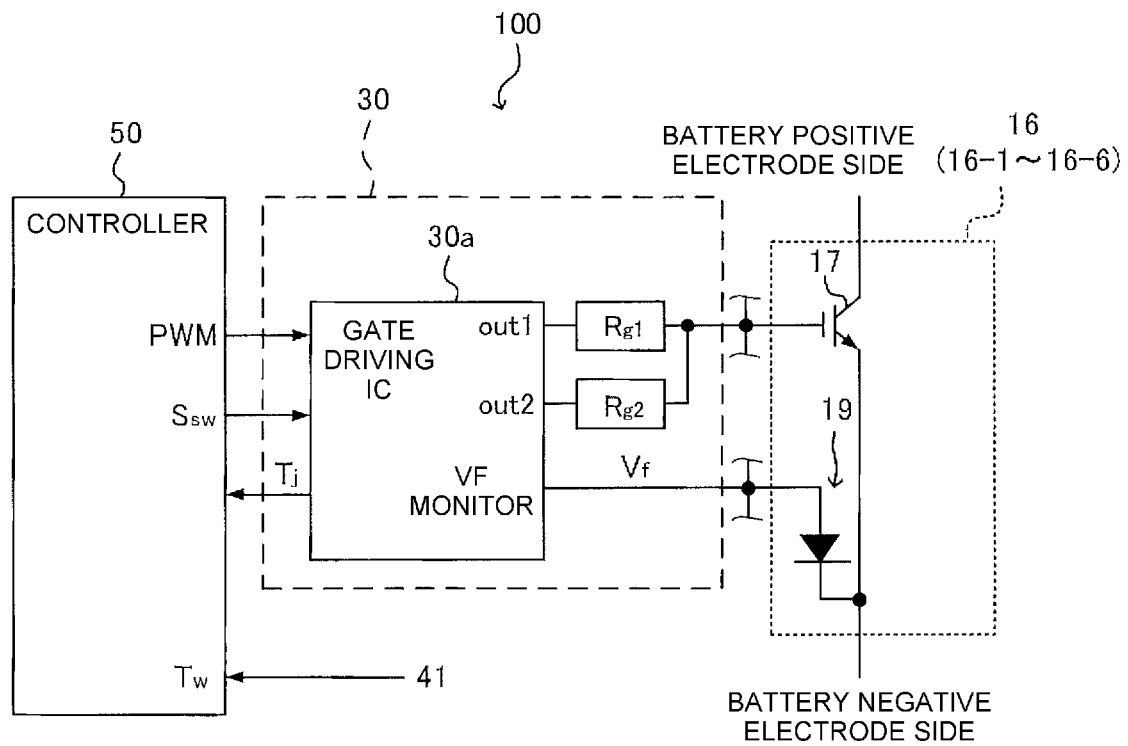
FIG. 2 is a diagram illustrating a configuration of a main part of the switching element driving device.

FIG. 2 is a diagram illustrating a configuration of a main part of the switching element driving device 100. For simplification, FIG. 2 illustrates only a connecting portion between the driving circuit 30 and one power semiconductor element unit 16. However, in the present embodiment, it is assumed that all the power semiconductor element units 16-1 to 16-6 are connected to the driving circuit 30 in a manner illustrated in FIG. 2.

The controller 50 makes the PWM signal as the input, and receives the element temperatures $T_j$ from a gate driving IC 30a of the driving circuit 30 and the cooling water temperature $T_w$ from the cooling water temperature sensor 41 as the inputs. The controller 50 then generates the speed switching signal $S_{sw}$ from these input values and outputs the speed switching signal $S_{sw}$ to the gate driving IC 30a.

The gate driving IC 30a of the driving circuit 30 receives the speed switching signal $S_{sw}$ as an input to set a gate resistance $R_g$ of the switching element 17. More specifically, with reference to the speed switching signal $S_{sw}$, the gate driving IC 30a switches the gate resistance $R_g$ of the switching element 17 between a relatively high first gate resistance $R_{g1}$ and a relatively low second gate resistance $R_{g2}$. Here, if the gate resistance $R_g$ is set to the relatively high first gate resistance $R_{g1}$, the switching speed becomes relatively low. Meanwhile, if the gate resistance $R_g$ is set to the relatively low second gate resistance $R_{g2}$, the switching speed becomes relatively high. More specifically, the higher the gate resistance $R_g$ of the switching element 17 is set, the smaller a gate current for charging and discharging a capacitance of the switching element 17, and thus the switching speed becomes lower. Conversely, the smaller the gate resistance $R_g$ of the switching element 17 is set, the larger the gate current, and thus the switching speed becomes higher. That is, in the present embodiment, a state in which the gate resistance $R_g$ of the switching element 17 is set to the relatively high first gate resistance $R_{g1}$ corresponds to a state in which the low speed mode is set as a control mode. Meanwhile, a state in which the gate resistance $R_g$ is set to the relatively low second gate resistance $R_{g2}$ corresponds to a state in which the high speed mode is set as the control mode. Further, as understood from FIG. 2, the gate driving IC 30a is configured to set the same gate resistance $R_g$ for all the power semiconductor element units 16-1 to 16-6. Therefore, the gate driving IC 30a simultaneously sets the first gate resistance $R_{g1}$ or the second gate resistance $R_{g2}$ for all the power semiconductor element units 16-1 to 16-6. That is, the gate driving IC 30a drives all the power semiconductor element units 16-1 to 16-6 in a manner of switching all the switching speeds between the low speed and high speed at once.

Therefore, in the switching element driving device 100 of the present embodiment, one driving circuit 30 collectively adjusts the switching speeds of all the power semiconductor element units 16-1 to 16-6. That is, the switching speeds of all the power semiconductor element units can be adjusted without providing a driving circuit for each of the power semiconductor element units 16-1 to 16-6. Therefore, the circuit configuration can be simplified and an increase in a size of the entire device can be prevented. Next, the processing in the controller 50 (in particular, processing related to generation of the speed switching signal $S_{sw}$) will be described in more detail.

Figure 3:
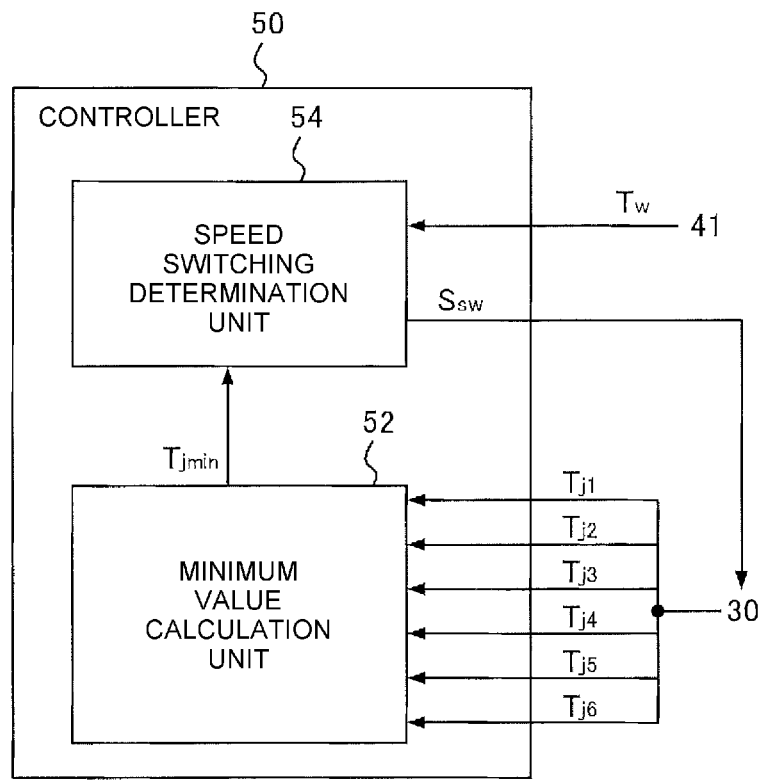
FIG. 3 is a block diagram illustrating functions for executing a switching element driving method in a controller.

FIG. 3 is a block diagram illustrating functions for executing a switching element driving method in the controller 50. As illustrated in the drawing, the controller 50 includes a minimum value calculation unit 52 and a switching signal generation unit 54. The minimum value calculation unit 52 calculates a minimum value among the element temperatures $T_{j1}$ to $T_{j6}$ (hereinafter, sometimes referred to as "minimum element temperature $T_{jmin}$") and outputs the minimum value to the switching signal generation unit 54.

The switching signal generation unit 54 determines the high speed mode in which the switching speed is relatively high or the low speed mode in which the switching speed is relatively low is required to be set as the control mode based on the cooling water temperature $T_w$ from the cooling water temperature sensor 41 and the minimum element temperature $T_{jmin}$ from the minimum value calculation unit 52. The switching signal generation unit 54 generates the speed switching signal $S_{sw}$ including a command to set an appropriate gate resistance $R_g$ for the driving circuit 30 according to the control mode required to be set.

It is generally known that a breakdown voltage of a semiconductor switching element tends to have a positive slope with respect to a temperature. Therefore, the switching speed of the semiconductor switching element can be made relatively high at a high temperature. Further, if the switching speed is increased, a loss of the element due to the switching is reduced. Therefore, in the present embodiment, when it can be determined that the switching element 17 is at a high temperature, the control mode is set to the high speed mode (the gate resistance $R_g$ is set to the second gate resistance $R_{g2}$) so as to relatively increase the switching speed.

Meanwhile, when the semiconductor switching element is at a low temperature, a switching surge is more likely to occur if the switching speed is increased. Therefore, it is preferable to keep the switching speed relatively low when the temperature is low. Therefore, in the present embodiment, when it can be determined that the switching element 17 is at a low temperature, the control mode is set to the low speed mode (the gate resistance $R_g$ is set to the first gate resistance $R_{g1}$) so as to relatively decrease the switching speed.

Accordingly, when the switching element 17 is at a high temperature, the switching speed is increased to reduce the loss due to the switching, whereas when the switching element 17 is at a low temperature, the switching speed can be decreased to prevent the switching surge and avoid the switching element 17 from being damaged more reliably.

Next, details of the switching signal generation processing will be described.

Figure 4:
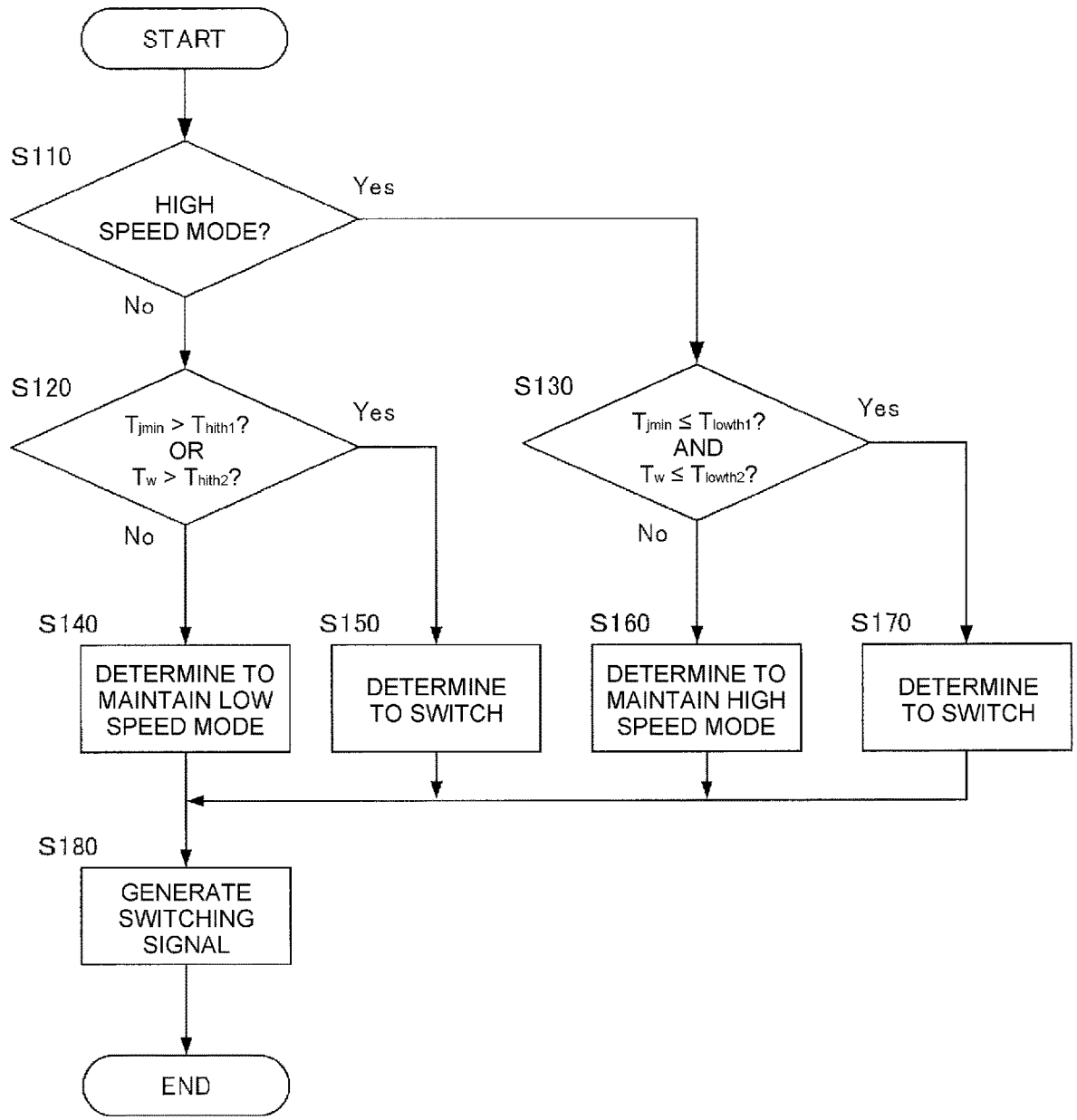
FIG. 4 is a flowchart of switching signal generation processing.

FIG. 4 is a flowchart for illustrating the switching signal generation processing. In the present embodiment, the controller 50 repeatedly executes the switching signal generation processing illustrated in FIG. 4 every predetermined calculation cycle.

First, in step S110, the controller 50 determines whether a current control mode related to the switching speed of the switching element 17 is set to the high speed mode. For example, with reference to a memory and the like of the driving circuit 30, the controller 50 determines whether the gate resistance $R_g$ in a previous control cycle is set to the second gate resistance $R_{g2}$. When the determination result is negative (when it is determined that the low speed mode is set as the control mode), the controller 50 proceeds to processing of step S120.

In step S120, the controller 50 determines whether the minimum element temperature $T_{jmin}$ exceeds a predetermined first high speed threshold $T_{hith1}$, or whether the cooling water temperature $T_w$ exceeds a predetermined second high speed threshold $T_{hith2}$.

Here, the first high speed threshold $T_{hith1}$ is set to a value of the minimum element temperature $T_{jmin}$ that is suitable from a viewpoint of determining that a switching loss of the switching element 17 exceeding an allowable range will occur if the low speed mode is maintained continuously. The second high speed threshold $T_{hith2}$ is set to a value of the cooling water temperature $T_w$ that is suitable from the viewpoint of determining that the switching loss exceeding the allowable range will occur if the low speed mode is maintained continuously. The first high speed threshold $T_{hith1}$ and the second high speed threshold $T_{hith2}$ may be fixed values determined in advance based on experimental results or the like, or may be variable values that vary according to an operating state of the switching element driving device 100 or the motor 20.

When a determination result of step S120 is negative, the controller 50 proceeds to step S140. In step S140, the controller 50 maintains the low speed mode which is the current control mode. That is, when both the minimum element temperature $T_{jmin}$ and the cooling water temperature $T_w$ do not reach the first high speed threshold $T_{hith1}$ and the second high speed threshold $T_{hith2}$ respectively set from a viewpoint of preventing the switching loss, the low speed mode is continued. Accordingly, in addition to the minimum element temperature $T_{jmin}$ that directly reflects an influence of heat generated by the switching element 17 which is a heat source, the cooling water temperature $T_w$ which is less sensitive to the heat generated by the switching element 17 than the minimum element temperature $T_{jmin}$ is used. Therefore, in determining whether to maintain the low speed mode, not only the minimum element temperature $T_{jmin}$ which easily varies according to the operating state of the switching element driving device 100, but also the cooling water temperature $T_w$ which hardly varies is used, and thus frequent switching (chattering) between the low speed mode and the high speed mode can be prevented.

If the determination result of step S120 is positive, the controller 50 proceeds to step S150. In step S150, the controller 50 switches the control mode from the low speed mode to the high speed mode. That is, when either one of the minimum element temperature $T_{jmin}$ and the cooling water temperature $T_w$ exceeds the respective thresholds of the first high speed threshold $T_{hith1}$ and the second high speed threshold $T_{hith2}$, the control mode is switched from the low speed mode to the high speed mode.

Therefore, in the present embodiment, when it is determined whether to switch the control mode from the low speed mode to the high speed mode, in parallel with the determination as to whether the minimum element temperature $T_{jmin}$ exceeds the first high speed threshold $T_{hith1}$, the determination as to whether the cooling water temperature $T_w$ exceeds the second high speed threshold $T_{hith2}$ is performed. Accordingly, a chance of switching the control mode from the low speed mode to the high speed mode can be increased, and an effect of reducing the switching loss can be further enhanced.

Meanwhile, when the determination result of the above step S110 is positive (when the high speed mode is set as the control mode), the controller 50 proceeds to processing of step S130.

In step S130, the controller 50 determines whether the minimum element temperature $T_{jmin}$ is equal to or lower than a predetermined first low speed threshold $T_{lowth1}$, and whether the cooling water temperature $T_w$ is equal to or lower than a predetermined second low speed threshold $T_{lowth2}$.

Here, the first low speed threshold $T_{lowth1}$ is set to a value of the minimum element temperature $T_{jmin}$ that is suitable from a viewpoint of determining that the switching surge exceeding an allowable range will occur if the high speed mode is maintained. The second low speed threshold $T_{lowth2}$ is set to a value of the cooling water temperature $T_w$ that is suitable from the viewpoint of determining that the switching surge exceeding the allowable range will occur if the high speed mode is maintained continuously. The first low speed threshold $T_{lowth1}$ and the second low speed threshold $T_{lowth2}$ may be fixed values determined in advance based on experimental results or the like, or may be variable values that vary according to the operating state of the switching element driving device 100 or the motor 20. Further, the first low speed threshold $T_{lowth1}$ and the second low speed threshold $T_{lowth2}$ may be appropriately set to the same value or may be set to different values.

When a determination result of step S130 is negative, the controller 50 proceeds to step S160. In step S160, the controller 50 maintains the high speed mode which is the current control mode. That is, when either of the minimum element temperature $T_{jmin}$ and the cooling water temperature $T_w$ exceeds the first low speed threshold $T_{lowth1}$ and the second low speed threshold $T_{lowth2}$ respectively set from a viewpoint of avoiding the switching surge (when neither the minimum element temperature $T_{jmin}$ nor the cooling water temperature $T_w$ is decreased to a temperature at which switching to the low speed mode is required), the high speed mode is continued.

Accordingly, in determining whether to continue the high speed mode, in addition to the minimum element temperature $T_{jmin}$, the cooling water temperature $T_w$ which is difficult to follow a variation in the operating state of the switching element driving device 100 is used, and thus the frequent switching (chattering) between the low speed mode and the high speed mode can be prevented.

Meanwhile, when the determination result of step S130 is positive, the controller 50 proceeds to step S170. In step S170, the controller 50 switches the control mode from the high speed mode to the low speed mode. That is, when both the minimum element temperature $T_{jmin}$ and the cooling water temperature $T_w$ drop to the respective thresholds of the first low speed threshold $T_{lowth1}$ and the second low speed threshold $T_{lowth2}$, the control mode is switched from the high speed mode to the low speed mode.

Therefore, in the present embodiment, if at least the minimum value among the element temperatures $T_{j1}$ to $T_{j6}$ becomes equal to or lower than the first low speed threshold $T_{lowth1}$, the control mode is switched from the high speed mode to the low speed mode. Therefore, from the viewpoint of avoiding the switching surge, a scene in which the switching speed is required to be decreased can be determined more reliably.

More specifically, depending on the operating state of the switching element driving device 100, a scene in which the element temperatures to $T_{j6}$ vary is assumed. An example of such a scene includes a case where a temperature variation occurs between phases due to a so-called motor lock (a state in which the motor 20 does not rotate even when power is supplied). In such a scene, a situation may arise in which some of the element temperatures $T_{j1}$ to $T_{j6}$ exceed the first low speed threshold $T_{lowth1}$, while the rest are equal to or lower than the first low speed threshold $T_{lowth1}$.

In this regard, in the present embodiment, a switching timing from the high speed mode to the low speed mode is determined based on not only the minimum element temperature $T_{jmin}$ but also whether the cooling water temperature $T_w$ is equal to or lower than the first low speed threshold $T_{lowth1}$. Therefore, even if a variation among the element temperatures $T_{j1}$ to $T_{j6}$ occurs, a safety margin in determining a decrease in the switching speed can be further increased, and occurrence of the switching surge can be avoided more reliably. In particular, in the present embodiment, in addition to the minimum element temperature $T_{jmin}$ that directly reflects the influence of heat generated by the switching element 17 which is the heat source, the cooling water temperature $T_w$ which is less sensitive to the heat generated by the switching element 17 than the minimum element temperature $T_{jmin}$ but exhibits a certain correlation is used. In particular, the cooling water temperature $T_w$ substantially coincides with a value obtained by subtracting a temperature rise amount $\Delta T$ of the cooling water corresponding to the above heat generation amount from the minimum element temperature $T_{jmin}$. Therefore, an influence of an actual temperature of the switching element 17 can be appropriately reflected in setting the switching timing while the safety margin for more reliably avoiding the occurrence of the switching surge is ensured more reliably as described above, and thus the switching timing can be determined more appropriately.

If the controller 50 executes any processing of steps S140 to S170, the processing proceeds to step S180. In step S180, the controller 50 generates the speed switching signal $S_{sw}$.

Specifically, when the processing of step S140 or step S170 is performed, the controller 50 includes in the speed switching signal $S_{sw}$ a command for the driving circuit 30 to select the relatively high first gate resistance $R_{g1}$ as the gate resistance $R_g$ (command to maintain the first gate resistance $R_{g1}$ or to switch to the first gate resistance $R_{g1}$). Meanwhile, when the processing of step S150 or step S160 is performed, the controller 50 includes in the speed switching signal $S_{sw}$ a command for the driving circuit 30 to select the relatively low second gate resistance $R_{g2}$ as the gate resistance $R_g$ (command to maintain the second gate resistance $R_{g2}$ or to switch to the second gate resistance $R_{g2}$).

According to the switching element driving method of the present embodiment described above, the following effects are exerted.

The present embodiment provides a switching element driving method executed in the switching element driving device 100 including the plurality of switching elements 17-1 to 17-6 and the driving circuit 30 that drives the switching elements 17. In the switching element driving method, temperatures (element temperatures $T_{j1}$ to $T_{j6}$) of the plurality of switching elements 17 are detected, a switching determination temperature (minimum element temperature $T_{jmin}$) that serves as a reference for changing switching speeds of the switching elements 17 is calculated from the detected element temperatures $T_{j1}$ to $T_{j6}$ (minimum value calculation unit 52). Then, the switching speeds of all the switching elements 17-1 to 17-6 are changed based on the above switching determination temperature.

Accordingly, the switching speeds of all the switching elements 17-1 to 17-6 are simultaneously adjusted with reference to the switching determination temperature which is one parameter. Therefore, one driving circuit 30 can uniformly execute switching driving of the switching elements 17-1 to 17-6 in the switching element driving device 100. Therefore, as compared with a case where a driving circuit is provided for each element, a circuit configuration can be simplified, and thus the device can be made more compact. In particular, since the number of parts can also be reduced, manufacturing costs are also reduced.

According to the switching element driving method of the present embodiment, a temperature of at least one of the plurality of switching elements 17 included in each of phases (U phase, V phase, or W phase) (temperature(s) of the switching element 17-1 and/or 17-4, temperature(s) of the switching element 17-2 and/or 17-5, and temperature(s) of the switching element 17-3 and/or 17-6), and the minimum element temperature $T_{jmin}$, which is the minimum value among the detected element temperatures $T_{j1}$ to $T_{j6}$, is calculated as the switching determination temperature. If the minimum element temperature $T_{jmin}$ becomes equal to or lower than a predetermined threshold (first low speed threshold $T_{lowth1}$), the switching speed is decreased (Yes in step S130 and step S170 in FIG. 4).

Accordingly, the switching speed is decreased when any one of the temperatures of the switching elements 17 of all phases becomes equal to or lower than the first low speed threshold $T_{lowth1}$. Therefore, even in a scene where the element temperatures $T_{j1}$ to $T_{j6}$ vary depending on the operating state of the switching element driving device 100, the switching speed can be decreased based on a determination criterion with a greater safety margin, and thus occurrence of a switching surge can be avoided more reliably.

Further, according to the switching element driving method of the present embodiment, external temperatures (cooling water temperature $T_w$) which are temperatures outside element modules (power semiconductor element units 16-1 to 16-6) including the switching elements 17 and correlate with the element temperatures $T_{j1}$ to $T_{j6}$ which are the temperatures of the switching elements 17 are further detected. Then, the switching speeds of all the switching elements 17-1 to 17-6 are changed based on both the above switching determination temperature and the cooling water temperature $T_w$.

Accordingly, in determining whether to change the switching speed, in addition to the minimum element temperature $T_{jmin}$, the cooling water temperature $T_w$, which is less sensitive to a variation in the operating state of the switching element driving device 100, is referred to. Therefore, it is possible to more reliably prevent the occurrence of chattering that may occur when only the minimum element temperature $T_{jmin}$, which is highly sensitive to the variation in the operating state, is used for determination.

According to the switching element driving method of the present embodiment, as a control mode of the switching speed of the switching element 17, a high speed mode in which the switching speed is relatively high or a low speed mode in which the switching speed is relatively low is set. When the low speed mode is set as the control mode (No in step S110 in FIG. 4), the control mode is switched to the high speed mode if the minimum element temperature $T_{jmin}$ exceeds the predetermined first high speed threshold $T_{hith1}$, or the cooling water temperature $T_w$ exceeds the second high speed threshold $T_{hith2}$ (Yes in step S120 and step S150). Meanwhile, when the high speed mode is set as the control mode (Yes in step S110 in FIG. 4), the control mode is switched to the low speed mode if the minimum element temperature $T_{jmin}$ is equal to or lower than the predetermined first low speed threshold $T_{lowth1}$ and the cooling water temperature $T_w$ is equal to or lower than the second low speed threshold $T_{lowth2}$ (Yes in step S130 and step S170).

Accordingly, a specific switching speed control logic that can suitably prevent both a switching loss and the occurrence of the switching surge is implemented.

In the present embodiment, when the switching speed is changed (when step S150 or step S170 is executed), it is preferable to change a dead time compensation value of the switching element 17 in accordance with a timing of changing the switching speed.

Accordingly, a step in a motor output caused by a change in switching delay time according to the change in the switching speed can be prevented.

Further, in the present embodiment, the switching element driving device 100 in which the switching element driving method described above is executed is provided.

The switching element driving device 100 includes the plurality of switching elements 17-1 to 17-6; a temperature sensor (temperature detection diodes 19-1 to 19-6) configured to detect temperatures of the plurality of switching elements 17 (element temperatures to $T_{j6}$); the driving circuit 30 configured to drive the switching elements 17; and the controller 50 as a control unit configured to control the driving circuit 30 based on the element temperatures $T_{j1}$ to $T_{j6}$, which are a plurality of temperature detection values detected by the temperature detection diodes 19-1 to 19-6. The controller 50 as the control unit calculates a switching determination temperature (minimum element temperature $T_{jmin}$) that serves as a reference for changing switching speeds of the switching elements 17 from the element temperatures $T_{j1}$ to $T_{j6}$ (minimum value calculation unit 52). The controller 50 changes the switching speeds of all the switching elements 17-1 to 17-6 based on the switching determination temperature (switching signal generation unit 54).

Accordingly, a suitable system configuration for executing the switching element driving method of the present embodiment is implemented.

Although the embodiments of the present invention have been described, the above embodiments are merely a part of application examples of the present invention, and do not mean that the technical scope of the present invention is limited to the specific configurations of the above embodiments.

For example, in the above embodiments, an example in which the temperature detection diodes 19-1 to 19-6 are respectively provided in all the power semiconductor element units 16-1 to 16-6 has been described. However, instead of this example, a configuration in which the temperature detection diodes 19 are provided only in some of the power semiconductor element units 16-1 to 16-6 may be adopted. For example, in the switching element driving device 100 illustrated in FIG. 1, a configuration may be adopted in which the temperature detection diodes 19 are only disposed in the upper arms UP, VP, and WP or in the lower arms UN, VN, and WN of the power semiconductor element units 16 in the phases (that is, three temperature detection diodes 19 are disposed), and the controller 50 calculates a minimum value of element temperatures $T_j$ detected by the three temperature detection diodes 19 as the minimum element temperature $T_{jmin}$, and executes subsequent processing. According to the configuration, it is possible to reduce the number of sensors and achieve cost reduction, while achieving adjustment of the switching speed in consideration of variations in the temperature according to the operating state of the switching element driving device 100.

In addition to the minimum element temperature $T_{jmin}$, any temperature parameter that correlates with changes in the element temperatures $T_{j1}$ to $T_{j6}$ may be appropriately used as the switching determination temperature that serves as the reference for changing the switching speed. For example, any representative value such as a maximum value, an average value, or a median value of the element temperatures $T_{j1}$ to $T_{j6}$ may be calculated as the switching determination temperature.

Further, in the above embodiment, an example of switching between two stages of high speed and low speed (first gate resistance $R_{g1}$ or second gate resistance $R_{g2}$) has been described as an aspect of changing the switching speed. However, the present invention is not limited to this example, for example, a configuration in which the switching speed is switched between three or more stages of a high speed, a medium speed, a low speed, and the like, or a configuration in which the switching speed is continuously switched may be adopted. In the above embodiment, an example using the gate resistance $R_g$ as an operation amount for changing the switching speed of the switching element 17 has been described. However, instead of or in addition to this example, any operation amount that can operate the switching speed of the switching element 17, such as a gate voltage, may be employed.

In the above embodiment, an example has been described in which the cooling water temperature $T_w$ detected by the cooling water temperature sensor 41 provided in the cooler 40 is used as a temperature outside the power semiconductor element unit 16. However, instead of this example, a temperature detected at another location may be used in place of the cooling water temperature $T_w$ as long as that temperature follows the temperature change in the power semiconductor element unit 16 with a certain sensitivity.

Figure 5:
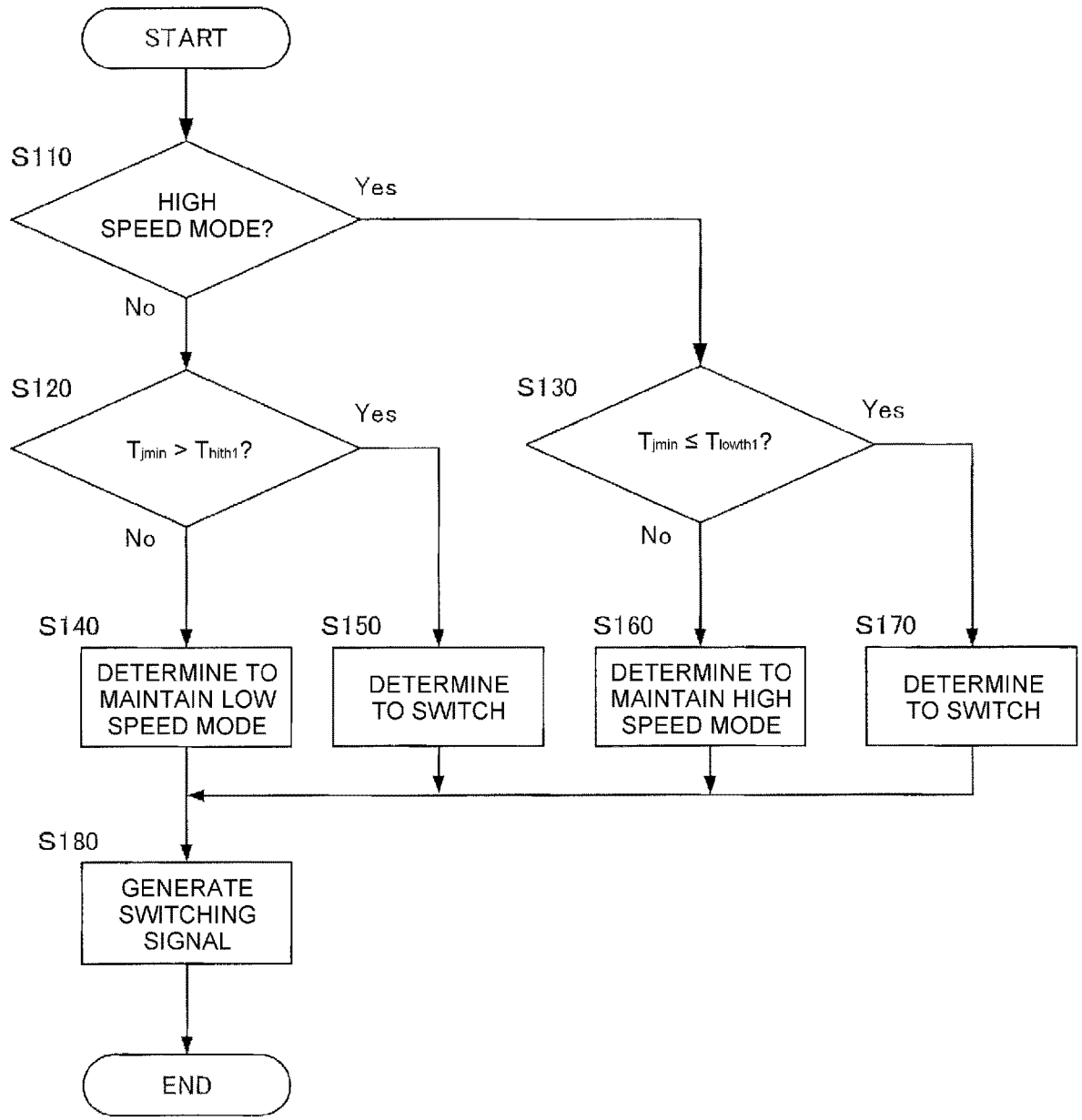
FIG. 5 is a flowchart of switching signal generation processing according to a modification.

Further, in the above embodiment, an example has been described in which switching signal generation processing is executed with reference to both the minimum element temperature $T_{jmin}$ and the cooling water temperature $T_w$. However, an aspect of executing the switching signal generation processing based only on the minimum element temperature $T_{jmin}$ as illustrated in FIG. 5 is naturally included in the scope disclosed in the original specification and the like of the present application, and is also included in the technical scope of the present invention.

The invention claimed is:
1. A switching element driving method executed in a switching element driving device including a plurality of switching elements distributed in different phases and a driving circuit configured to drive the plurality of switching elements, the switching element driving method comprising:

detecting a plurality of temperatures of at least one switching element of the plurality of switching elements included in each of the phases;

calculating a minimum value among the plurality of detected temperatures as a switching determination temperature that serves as a reference for changing switching speeds of the switching elements; and decreasing the switching speeds of all of the switching elements if the switching determination temperature is equal to or lower than a predetermined threshold.

2. The switching element driving method according to claim 1, further comprising:

detecting an external temperature which is a temperature outside an element module including the switching elements and is correlated with the temperature of the switching elements; and changing the switching speeds of all the switching elements based on both the switching determination temperature and the external temperature.

3. The switching element driving method according to claim 2, further comprising:

setting, as a control mode of the switching speeds of the switching elements, a high speed mode in which the switching speeds are relatively high or a low speed mode in which the switching speeds are relatively low;

when the low speed mode is set as the control mode, switching the control mode to the high speed mode if a minimum value of the temperatures of the switching elements exceeds a predetermined first high speed threshold, or the external temperature exceeds a predetermined second high speed threshold; and when the high speed mode is selected as the control mode, switching the control mode to the low speed mode if the minimum value of the temperatures of the switching elements is equal to or lower than a predetermined first low speed threshold and the external temperature is equal to or lower than a predetermined second low speed threshold.

4. The switching element driving method according to claim 1, further comprising: when changing the switching speed of the switching elements, changing a dead time compensation value of the switching elements in accordance with a timing of the change.

5. A switching element driving device, comprising:

a plurality of switching elements distributed in different phases;

a temperature sensor configured to detect temperatures of the plurality of switching elements;

a driving circuit configured to drive the switching elements; and a control unit configured to control the driving circuit based on a plurality of temperature detection values detected by the temperature sensor, wherein the control unit is further configured to:

calculate a minimum value among the plurality of the temperature detection values of at least one of the plurality of switching elements included in each of the phases as a switching determination temperature that serves as a reference for changing switching speeds of the switching elements, and decreasing the switching speeds of all of the switching elements if the switching determination temperature is equal to or lower than a predetermined threshold.

* * * * *